(12) United States Patent
Widmer et al.

(10) Patent No.: US 6,429,794 B1
(45) Date of Patent: Aug. 6, 2002

(54) FORMAT CONVERTER

(75) Inventors: Albert X. Widmer, Katonah; Charles L. Haymes, Wesley Hills; Benjamin D. Parker, Peekskill, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/609,048

(22) Filed: Jun. 30, 2000

(51) Int. Cl.$^7$ .................................................. H03M 9/00
(52) U.S. Cl. ....................................................... 341/100
(58) Field of Search ................................. 341/100, 101; 395/891, 885

(56) References Cited

U.S. PATENT DOCUMENTS 6,140,946 A * 10/2000 Desrosiers .................. 341/100

* cited by examiner

Primary Examiner—Brian Young
(74) Attorney, Agent, or Firm—Ference & Associates

(57) ABSTRACT

A format converter in which the data input is a 16 bit wide interface. The circuit finds the 66-bit coding block boundaries. In one embodiment, a circuit presents the 66-bit data blocks at the output in an aligned format. The circuit relies on control inputs from a state machine which controls the operating mode and to which it delivers status information. The two main operating modes are the "normal data" mode or the "hunt" mode for the 66-bit block boundaries.

19 Claims, 13 Drawing Sheets

| 0:15 | 15 | 16:31 | 31 | 32:47 | 47 | 48:63 | 63 |
|---|---|---|---|---|---|---|---|
| 0:11 26 | 37 | 11:22 | 48 | 22:33 59 | | 33:44 70 | |
| | | | | | | 44:55 81 | 55:63 92 |
| 64:79 | 79 | 80:95 | 95 | 96:111 | 111 | 112:127 | 127 |
| *66:77 92 | 103 | 77:88 114 | | 88:99 125 | | 99:110 136 | |
| | | | | | | 110:121 147 | 121:127 158 |
| 128:143 | 143 | 144:159 | 159 | 160:175 | 175 | | |
| **132:143 158 | 169 | 143:154 4 | | 154:165 15 | | 165:175 26 | |

| 15-79 | | | 31-95 | | 47-111 | | | 63-127 | |
|---|---|---|---|---|---|---|---|---|---|
| 26 | 37 | 48 | 48 | 59 | 59 | 70 | 81 | 81 | 92 |
| 11 | | 31 | 17 | 36 | 12 | | 30 | 18 | 35 |
| 79-143 | | | 95-159 | | 111-175 | | | 127-63 | |
| 92 | 103 | 114 | 114 | 125 | 125 | 136 | 147 | 147 | 158 |
| 13 | | 29 | 19 | 34 | 14 | | 28 | 20 | 81 |
| 143-15* | | | 159-31* | | 175-47* | | | | |
| 158 | 169 | 4* | 4* | 15* | 15* | | 26* | | |
| 15 | | 11 | 21 | 16 | 16 | | 21 | | |

*Next 0 to 175 cycle

FIG. 6

FORMAT CONVERTER

FIELD OF THE INVENTION

The present invention relates generally to a deserializer and components therefor, including format converters.

BACKGROUND OF THE INVENTION

Of late, for some versions of the serial physical layer of the EEE 10 Gbit/s Ethernet standard, a new 66-bit block code has been suggested. At the receiver, the serial data is first de serialized to a sequence of 16 parallel bits which are not aligned with any block or framing structure. Each 66-bit block starts with a 2-bit prefix, a pair of complementary bits to indicate either regular data or control information in the next 8 scrambled bytes. Equal bits in the prefix are a violation of the coding rules. Such violations might originate from transmission errors. The pair of complementary bits is also used to find the 66-bit block boundaries, since any other pair in scrambled data will not have complementary bits at 66-bit intervals over an extended range such as 64 66-bit blocks.

A need has been recognized in connection with addressing the issues described above in an efficient and effective manner.

SUMMARY OF THE INVENTION

In accordance with at least one presently preferred embodiment of the present invention, in the context described heretofore, block boundaries are found with a modest amount of circuitry. Further, the conversion from a 16-bit block format to a 66-bit block format is undertaken via register transfers between registers of modest size. Whereas one might normally be inclined to seek a solution based on the least common multiple between 16 and 66 (which is 16×11×3=528), and use a register of that size, the present invention broadly contemplates enabling the use of a register of considerably smaller size but with similar effect.

A format converter in which the data input is a 16 bit wide interface. The circuit finds the 66-bit coding block boundaries. In one embodiment, a circuit presents the 66-bit data blocks at the output in an aligned format. The circuit relies on control inputs from a state machine (not described here) which controls the operating mode and to which it delivers status information. (As known in the art, a "state machine" is essentially any logic block with at least one latch with internal feedback to change states). The two main operating modes are the "normal data" mode or the "hunt" mode for the 66-bit block boundaries.

In an exemplary (non-restrictive) application according to at least one embodiment of the present invention, part of a 10.3125 Gbaud 64B/66B version of a deserializer is involved. The data input is a 16 bit wide interface clocked at a 644.53125 MHz rate (103125/16). The circuit finds the 66-bit coding block boundaries. A circuit presents the 66-bit data blocks at the output in an aligned format clocked at 156.25 MHz (10,000/64 or 10,312 5/66).

In one aspect, the present invention provides an apparatus for converting data, the apparatus comprising: an input interface which accepts data having a 16-bit width; a converter which converts the 16-bit width data to data having a 66-bit width in aligned format, and an output interface which outputs the aligned 66-bit width data.

In another aspect, the present invention provides a method for converting data, the method comprising the steps of: accepting data having a 16-bit width; converting the 16-bit width data to data having a 66-bit width in aligned format; and outputting the aligned 66-bit width data.

Furthermore, the present invention provides in another aspect, a program storage device readable by machine, tangibly embodying a program of instructions executable by the machine to perform method steps for converting data, the method comprising the steps of: accepting data having a 16-bit width, converting the 16-bit width data to data having a 66-bit width in aligned format; and outputting the aligned 66-bit width data.

For a better understanding of the present invention, together with other and further features and advantages thereof, reference is made to the following description, taken in conjunction with the accompanying drawings, and the scope of the invention will be pointed out in the appended claims.

BRIEF DESCRIPTION OF THE DRAWINGS

FIG. 5 schematically depicts a 64 bit register with write and read timing.

FIG. 6 schematically depicts a 64-bit register with margins for read timing.

DESCRIPTION OF THE PREFERRED EMBODIMENTS

Figure 1:
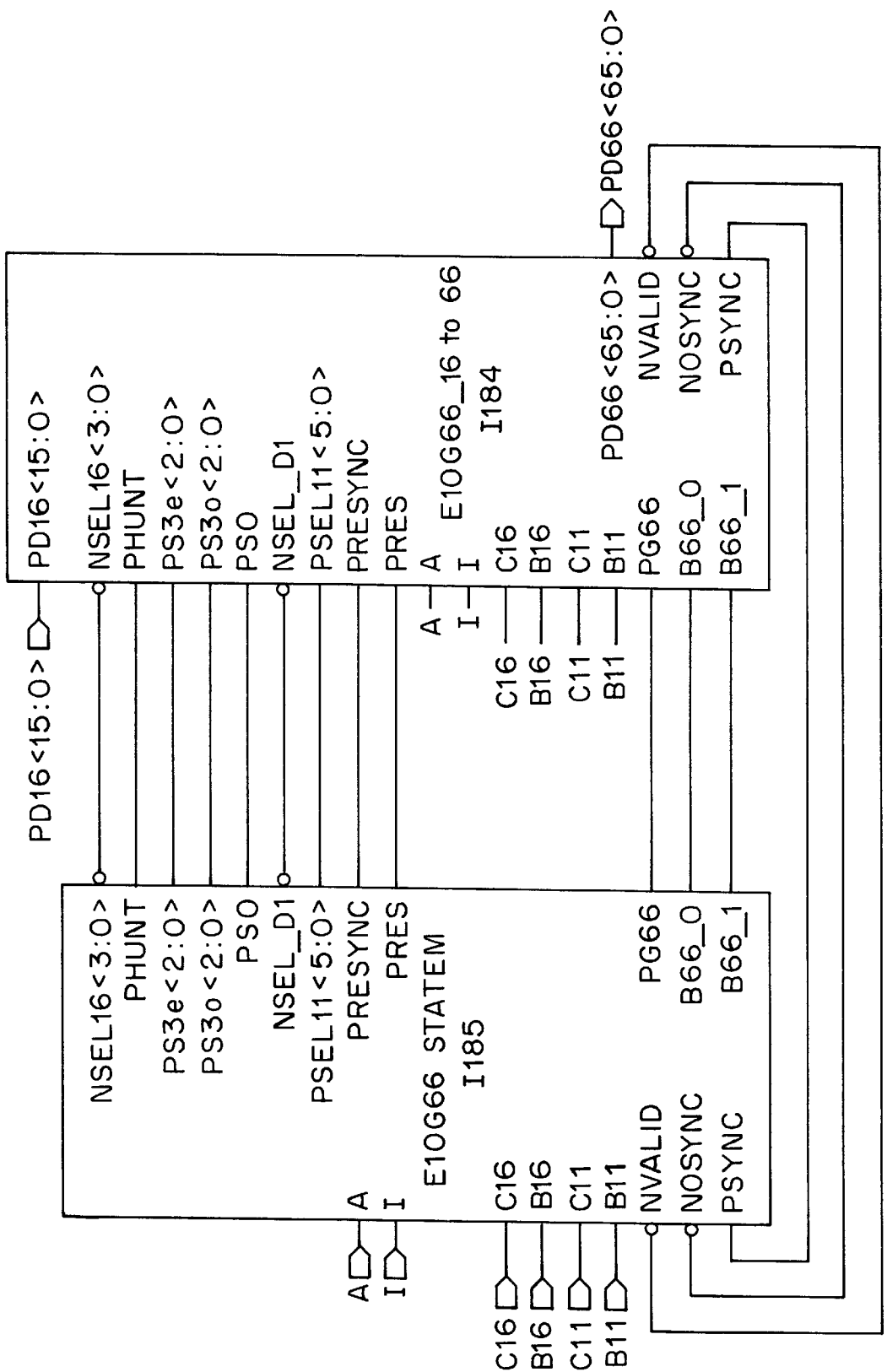
FIG. 1 depicts a circuit diagram of a 66b framer.

FIG. 1 illustrates an overall structure in accordance with an embodiment of the present invention and external input/output signals. The left-side block represents the state machine and the right-side block is the 16 bit (PD16<15:0>) to 66 bit (PD66<65:0>) converter. C11 and B11 are clock inputs operating at 1/11 of the full serial rate (10.3125 Gbaud). C16 and B166 are also clocks operating at 1/16 of the serial rate. The A and I inputs are test control inputs.

Figure 2:
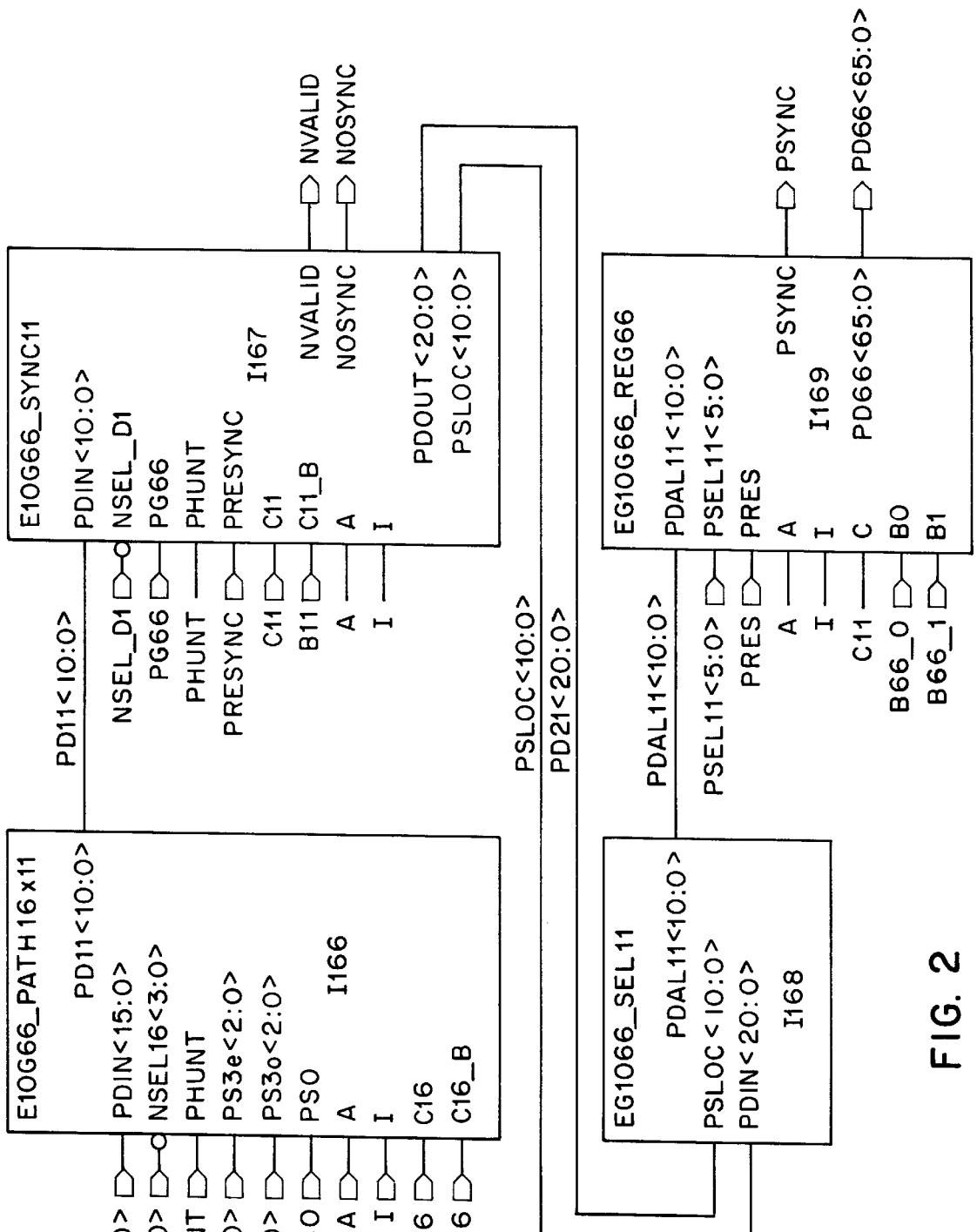
FIG. 2 depicts a circuit diagram of a deserializer (16b to 66b).

FIG. 2 illustrates a 16b to 66b deserializer in accordance with an embodiment of the present invention. Constituent components thereof are detailed in other Figures depicting circuit diagrams, namely, FIGS. 3, 8–11 and 13–15. The disclosure herebelow will first treat the deserializer shown in FIG. 2 and then will address the constituent components shown in the balance of the Figures.

In FIG. 2, the first block at the top (PATH16×11) converts the 16 bit wide bus to an 11-bit bus. In the hunt mode, it looks for transitions between any two bits and at the 11-bit boundaries and in this mode, the output PD11<10:0> marks transitions rather than data. The second block, SYNC 11, monitors for transitions which occur at 66-bit intervals in 11 positions at a time. If there are no transitions consistently occurring at the block interval, the output NOSYNC is asserted and the state machine selects the next group of 11 bits for the same check. In the absence of errors, up to 6 groups of 11 bits have to be checked consecutively. The groups are selected by the state machine by activating the signal NSEL_D1 at the appropriate time. As far as an "appropriate time" is concerned, preferably, a new 11-bit group will be selected as soon at it becomes apparent that the current group does not include the 2-bit prefix, which is indicated by an active level on the line NOSYNC. Further, the detail timing will preferably be correct, which would involve the line NSEL_D1 being asserted when a new group to be monitored is present at the L2 output of register I0<10:0> in FIG. 10 and the timing margins being such that the data is captured reliably.

If a single repetitive transition remains within an 11-bit group, the signal NVALID is asserted and the state machine decides whether further monitoring is required or whether the hunt mode can be ended. If the hunt mode is terminated, the location of the boundary is stored in latches by the input PRESYNC and signaled by the output PSLOC<10:0> which points to the first bit of 11-bit segments aligned with the 66-bit block boundaries. The state machine keeps track which of the 11-bit segments is the first one in the 66-bit block.

Preferably, the circuit SEL 11 selects an aligned set of 11 bits from 11 possible locations for delivery to the 66-bit output register. On the other hand, the circuit REG66 is the 66-bit output register. The state machine steers the sets of 11 bits into the proper location via the signal PSEL 11<5:0>. The data output PD66<65:0> is updated by the 156.25 MHz clock B0. In the normal data mode, the circuit monitors for unequal bits in PD66<0,1>. If these bits are equal the output PSYNC is deasserted and can only be reasserted by the state machine by asserting the input PRES.

Figure 3:
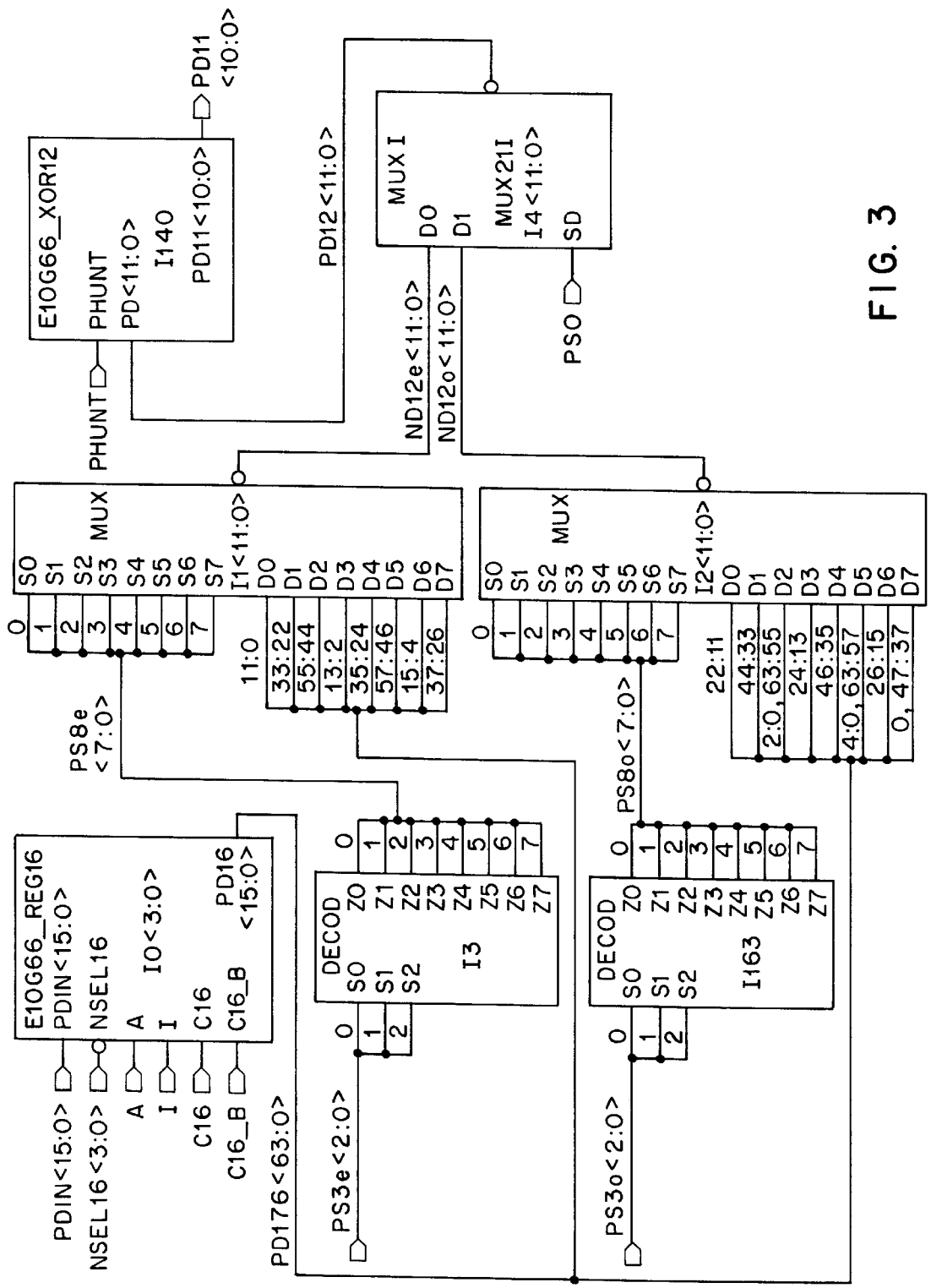
FIG. 3 depicts a circuit diagram of a multiplexer (16b unaligned to 11).

FIG. 3 shows a multiplexer, 16b unaligned to 11. Accordingly, this diagram illustrates two major functions:

1. A format conversion from 16 bits wide to 12 bits wide on 11-bit increments (1 bit overlap between successive sets of 12 bits).

2. Eleven parallel searches for unequal bit pairs.

In undertaking format conversion from. 16-bit to 12-bit width, a rather straightforward approach would write 11×16 bits into a 176-bit register and then read from there 12 bits at 11-bit increments (with roll-over) 16 times. (The width, expressed as a number of bits [12 bits in a presently preferred implementation], must have a certain relationship to the number 66, that is, the width after subtraction of one must be an integer factor of 66, i.e. 3−1=2, 4−1=3, 12−1=11, 23−1=22, or 34−1=33. A smaller width would essentially be suitable for much faster circuits or a lower operating rate while a greater width would essentially be suitable for slower circuits or a higher operating rate.)

The approach shown here saves silicon area (i.e., surface area of the silicon chip) by reducing the number of latches to 64 and just moderately increasing the complexity of the controls.

Figure 4:
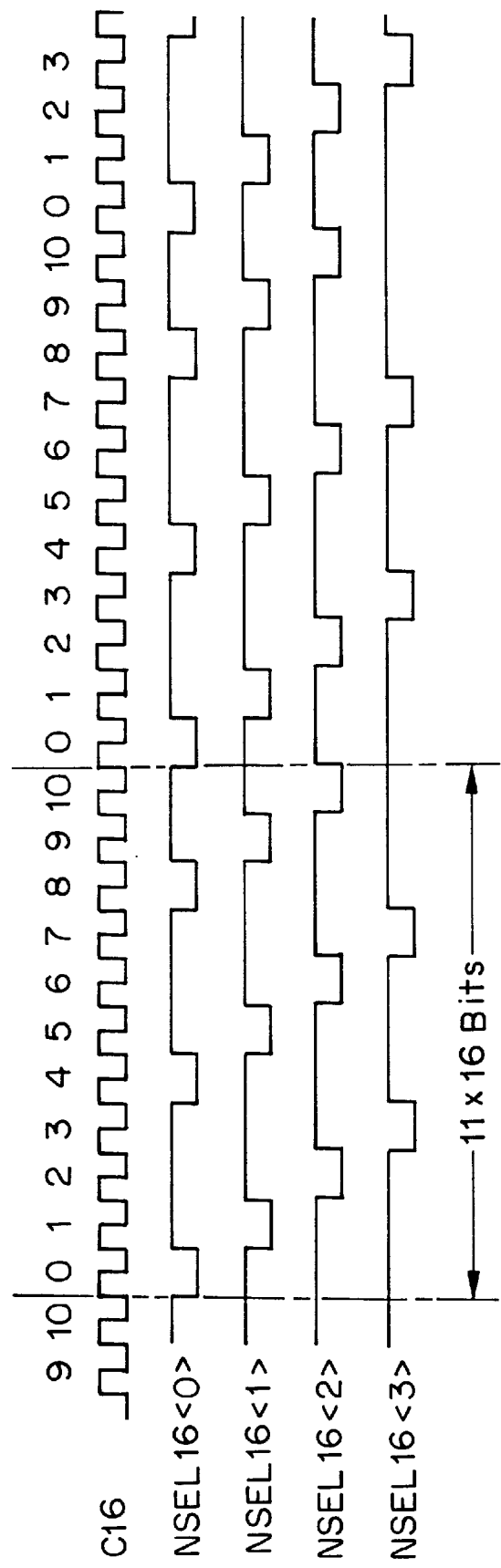
FIG. 4 schematically depicts a write control (PSEL 16).
Figure 8:
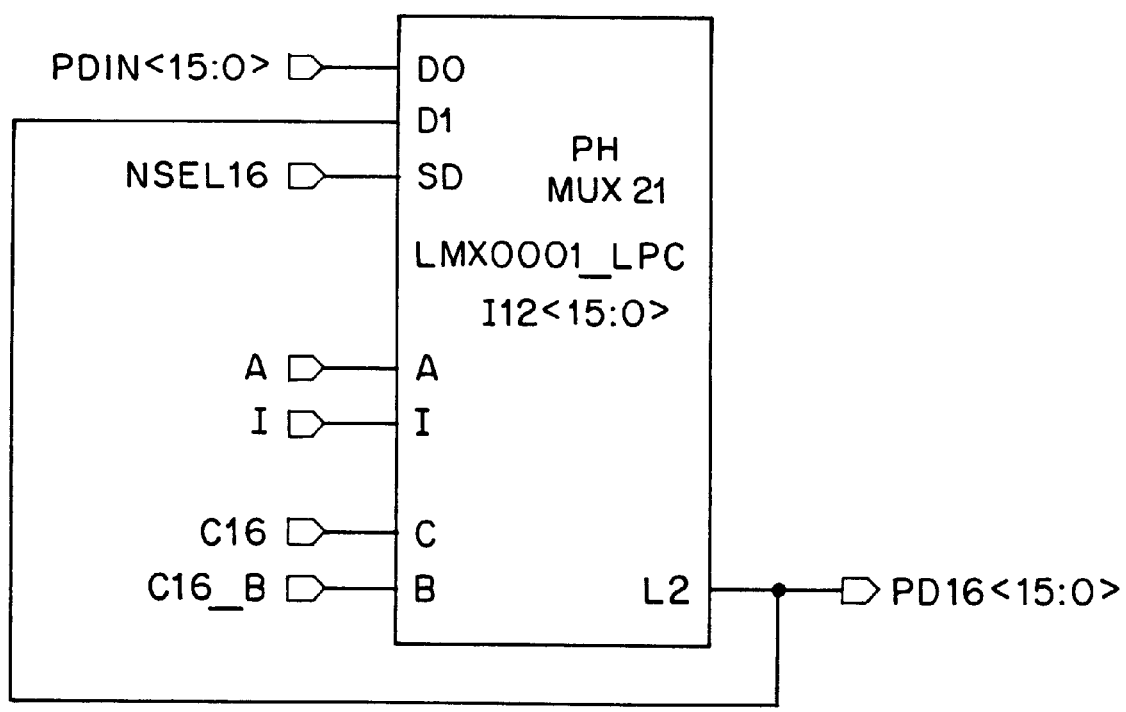
FIG. 8 depicts a circuit diagram of a 16-bit register.

To implement the embodiment of the present invention illustrated in the Figures, the 16 bit wide input (PD16<15:0>) from the deserializer is first placed consecutively into four sets of 16-bit registers E10G_REG16<3:0>. The 16-bit registers are shown in FIG. 8, and the set of four 16-bit registers is shown at the top of FIG. 3. A C16 clock (644.53125 MHz) drives all 64 L1 latches. A control signal NSEL 16<3:0> selects sequentially one of the four 16-bit registers for updating by selecting the D0 input in circuit E10G66_REG16 (FIG. 8) while the other registers step in place because the D1 input is selected which is connected to the L2 output. Each of these four control lines is at the lower level in turns for a single C16 clock cycle except that after eleven 16-bit cycles, a 16-bit register is skipped in conformance with an 11×C16 (176 bits) super-cycle to make the 4×16 register structure compatible with the cycle of 11 for the read-out from the registers. The control signals NSEL16<3:0> are illustrated in FIG. 4. The illustrations assume that the last 16-bit register is skipped.

The writing into and reading from the 64-bit register is illustrated in FIG. 5, where everything, including bit numbers and clock timing, is referenced to the basic repetition cycle of 176 (11×16) in ascending vector notation <0:175>. There are three major rows representing the contents of the 64-bit register for a full 176-bit cycle. Each row is horizontally divided into an upper and a lower part. The upper part shows the bit numbers residing in the register together with the respective write times to the right. The lower part shows how the bits are read in groups of 12 at 11-bit increments. In these fields, the vertical solid and dotted lines mark the start and end, respectively, of the 12-bit sets for read-out with a 1-bit overlap and wrap around from bit number 175 to 0. The sampling times for the reading of the 12-bit sets are also given and selected so they lag and lead the respective write times by at least 11-bit intervals in either direction.

FIG. 6 is similar in format to FIG. 5. The top line in each of the major rows indicates the valid interval for each set of 16 bits, the second line lists all the read times applicable to the respective set, and the third line first lists the timing margin ahead of the earliest read time and then the timing margin from the last read time to the end of the valid window. If the margins turn out to be too tight, or if faster circuits become available, other but similar register sizes may be suitable. Note that the current register operation can be described as 2×(4×16 bits)+1×(3×16b)=11×16b. With faster circuits, one could choose a 48-bit register operated as 3×(3×16b)+1×(2×16b), or a 32-bit register operated as 5×(2×16b)+1×16b. For slower circuits, a suitable choice is a 96-bit register operated as 1×(6×16b)+1×(5×16b).

Figures 7, 12:
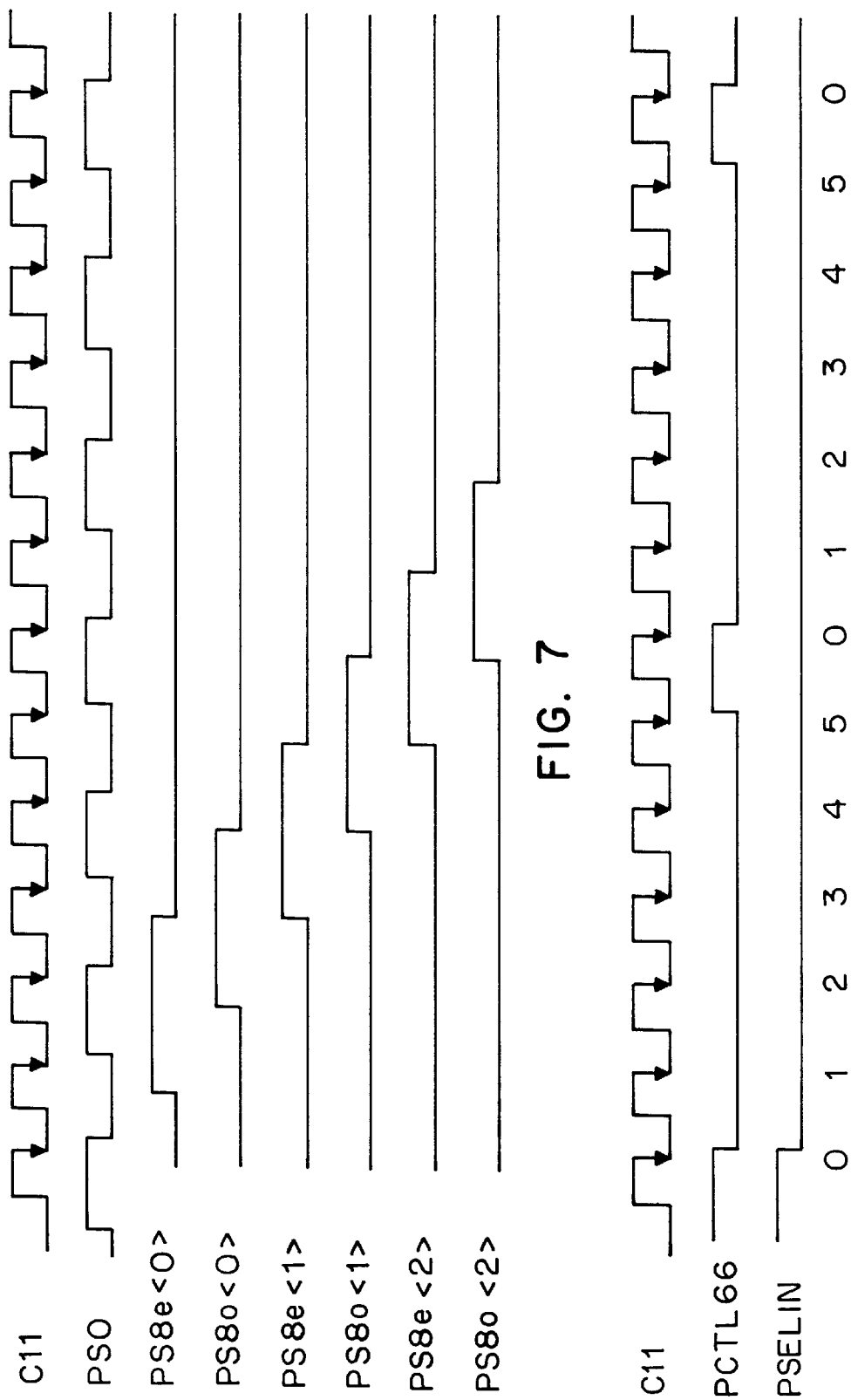
FIG. 7 schematically depicts C11, PS0 and PS8 timing.
FIG. 12 schematically depicts C11, PCTL66 timing.

At the output of the 64-bit register, a two-level arrangement of path gates selects sets of 12 bits at a time as shown in FIG. 3. The path gates are controlled by the signals PS0, PS3e<2:0>, and PS3o<2:0>. To reduce the required timing margins, the faster MUX211 gates in the lower right half toggle between the 2 inputs on every 11-bit cycle in response to signal PS0, while the two slower 'decod' circuits are stepped at 22-bit intervals in response to the signals PSe/o<2:0>. A suitable phase relationship between the clock C11 and the gating control signals PS0, PS8e<7:0>, and PS8o<7:0> is illustrated in FIG. 7. The inputs to each of the decoders which generate PSe (even) and PS8o (odd) are 3 bits. The signals PS3o<2:0> are the same as PS3e<2:0> but delayed by a C11 clock cycle.

The disclosure now turns to a discussion of a pattern search for 01 or 10, and the manner in which this can be facilitated in accordance with at least one presently preferred embodiment of the present invention.

Figure 9:
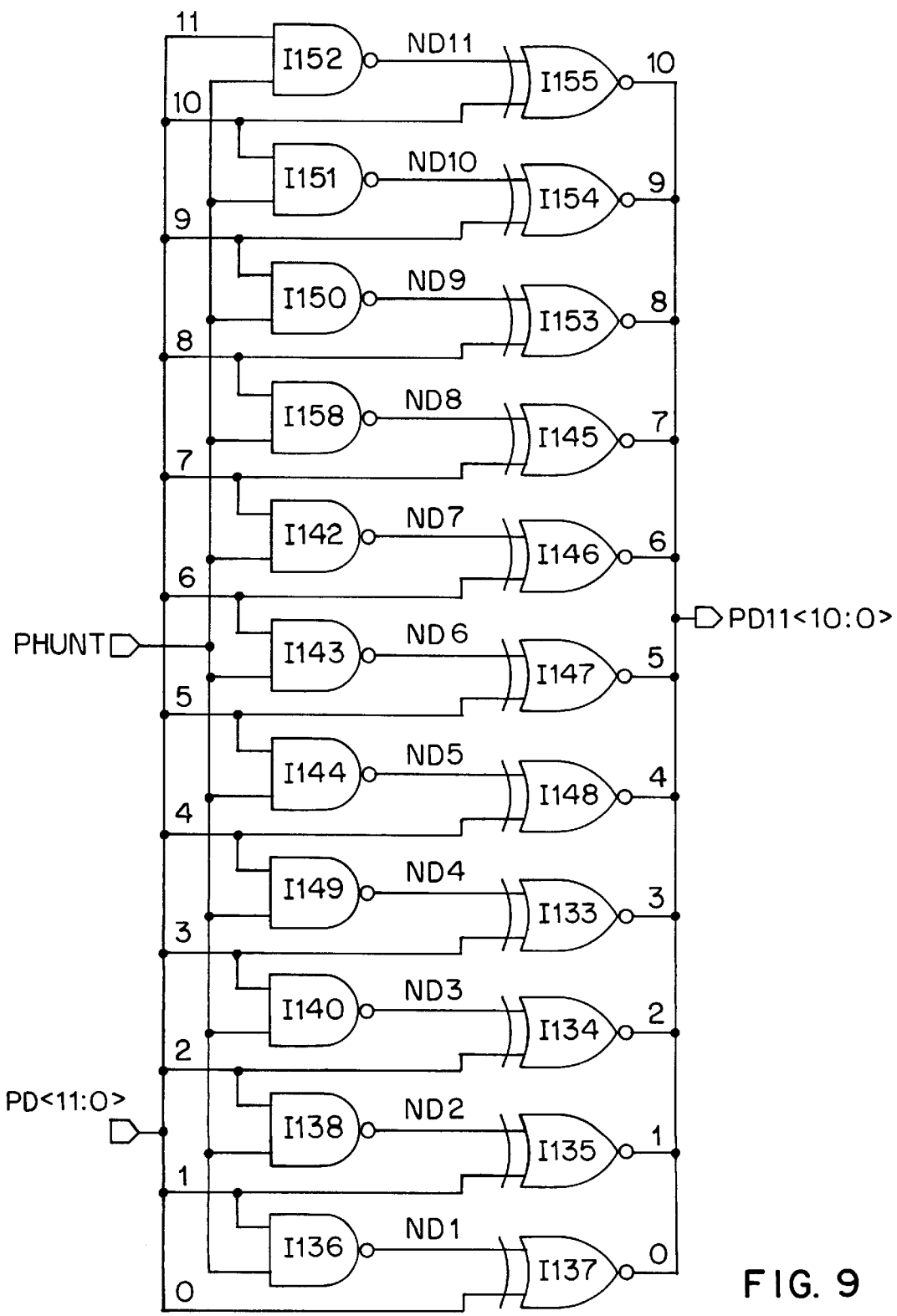
FIG. 9 depicts a circuit diagram of exclusive OR functions.

FIG. 9 relates to parallel examination, E10G66_XOR12. As shown, from the 64-bit register, 12 bits at a time are preferably examined for '01' or '10' patterns by 11 Exclusive OR gates. Each of the selected 12-bit fields overlaps by one bit with the next field on a cycle time of 11-bit intervals.

An input PHUNT to the E10G66_XOR12 circuit (as shown in FIG. 9) preferably chooses the normal data transfer mode or the sync hunt mode during initialization or when alignment has been lost. In normal mode, the XOR12 circuit just passes transparently the first 11 selected bits, ignoring the 12th bit which overlaps with the next group of 12 bits. In the hunt mode, any pair of adjacent unequal bits generates an upper level in the bit position of the first bit of the pair, and a lower level if the bits of the pair are equal. The output signals PD11<10:0> (FIGS. 2 and 3) represent the plain data or the XOR12 results and are stored in a set of 11 latches (upper left corner of FIG. 10).

Figure 10:
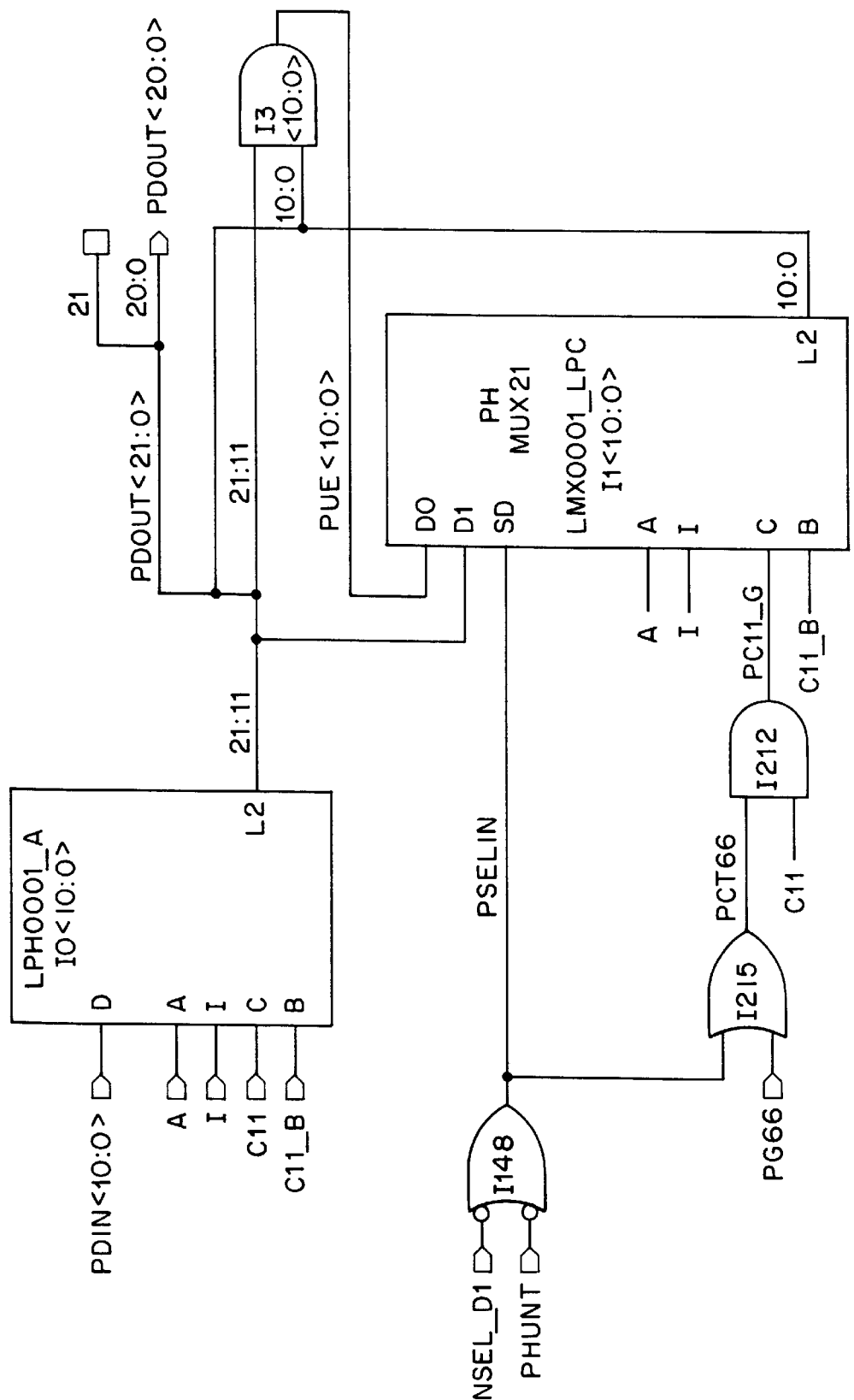
FIG. 10 depicts a circuit diagram of two 11-bit registers (SYNC pattern search).

FIG. 10 relates to serial examination, E10G66_SYNC11. In this case, the circuit SYNC11 (FIGS. 10 and 11) checks for 11 threads in parallel whether there are unequal bit pairs or sync patterns present six clock cycles apart. In the circuit of FIG. 10, there are two 11-bit registers operating in tandem. The trailing register is of the MUX21 type. In the normal data mode, these registers carry the data clocked on every C11 cycle, and the input to the second register is via the D1 inputs as selected by an upper level on the line PSELIN. In hunt mode, the registers indicate the location of transitions or sync patterns in the data. If e.g. PDOUT<11> is at the upper level, there is a transition between the data bit PDOUT<11> and <12>. If PDOUT<21> is at the upper level, there is a transition between the data bit PDOUT<21> and PDOUT<11> of the: next set of 11 data bits. Hunting for a repetitive sync pattern 66 bits apart is done on a set of 11 threads in parallel at a time on a cycle of 6×C11, until either no or a single repetitive sync pattern is present. The single sync pattern must be present consistently with no interruption for a programmable number of C66 cycles no lower than 16. If no sync pattern is present in any of the 11 positions of register I1<10:0>, a new search is started by the attached state machine on a set of 11 threads offset from the preceding set by 11 (serial) bits or one 11-bit register cycle, so in the absence of errors, it may take up 6 rounds of checks to find the true synchronization, longer if errors are present.

The maximum hunt time can be reduced by a factor of six at the cost of five additional 11-bit registers and gates (identical to I1<10:0> and I3<10:0>) and additional control inputs similar to PG66 from the state machine to perform the sequence test on six sets of 11 bits staggered by just one C11 clock.

At the start of each round of checks, the trailing register is loaded directly via the D1 input ports with the sync pattern stored in the leading register. For the second and following cycles of the round, the control signal PSELIN selects the D0 ports, which is gated data, such that the contents of the latches can only revert to zero. The trailing register cells cannot be set to an upper level output via the D0 input. (Expressed more specifically, the AND gates I3<10:0> in FIG. 10 prevent the D0 input of the latches to ever go to the up level if the respective L2 latch has a zero output.)

The requirements for the PSELIN signal which selects the D0 or D1 inputs of register I1<10:0> can be described as follows:

1. In normal data mode, PSELIN must remain at a steady upper level to select the D1 inputs.
2. If the state machine advances from normal data mode to the Hunt mode, PSELIN must remain at the upper level for the first two C11 cycles to make sure that an initial transition pattern is loaded into the trailing register.
3. After a search round has been started with an initial transition pattern in the trailing register, PSELIN must go to the lower level and remain there to the end of the round.
4. Any new round following the initial round in Hunt mode, must start with the loading of an initial transition pattern into the trailing register via the D1 ports and during this single C11 cycle, the PSELIN signal must revert to the upper level.

The requirements for the clock gating signal PCTL66 can be described as follows:

1. Whenever the PSELIN signal is at the upper level, PCTL66 must also be at the upper level so the trailing register is updated on every C11 clock cycle.
2. When the PSELIN signal is at the lower level, the PCTL66 signal enables the C11 clock every sixth C11 clock interval as illustrated in FIG. 12.

The pattern search as a whole is preferably operating on a cycle of n×(6×C11). In the hunting mode as shown in FIG. 12 and the circuit of FIG. 10, a first register 10<10:0> at the top left is updated on every C11 cycle, a second register I1<10:0> is updated only every 6th cycle e.g. at times C11(0, 6, 12, 18, . . . ). If the search on these fields is not successful, other searches are started at times C11(1, 7, 13, 19, . . . ), C11(2 ,8, 14, 20, . . . ), and so on until a consistent sequence of transitions at 66-bit intervals is detected.

Figure 11:
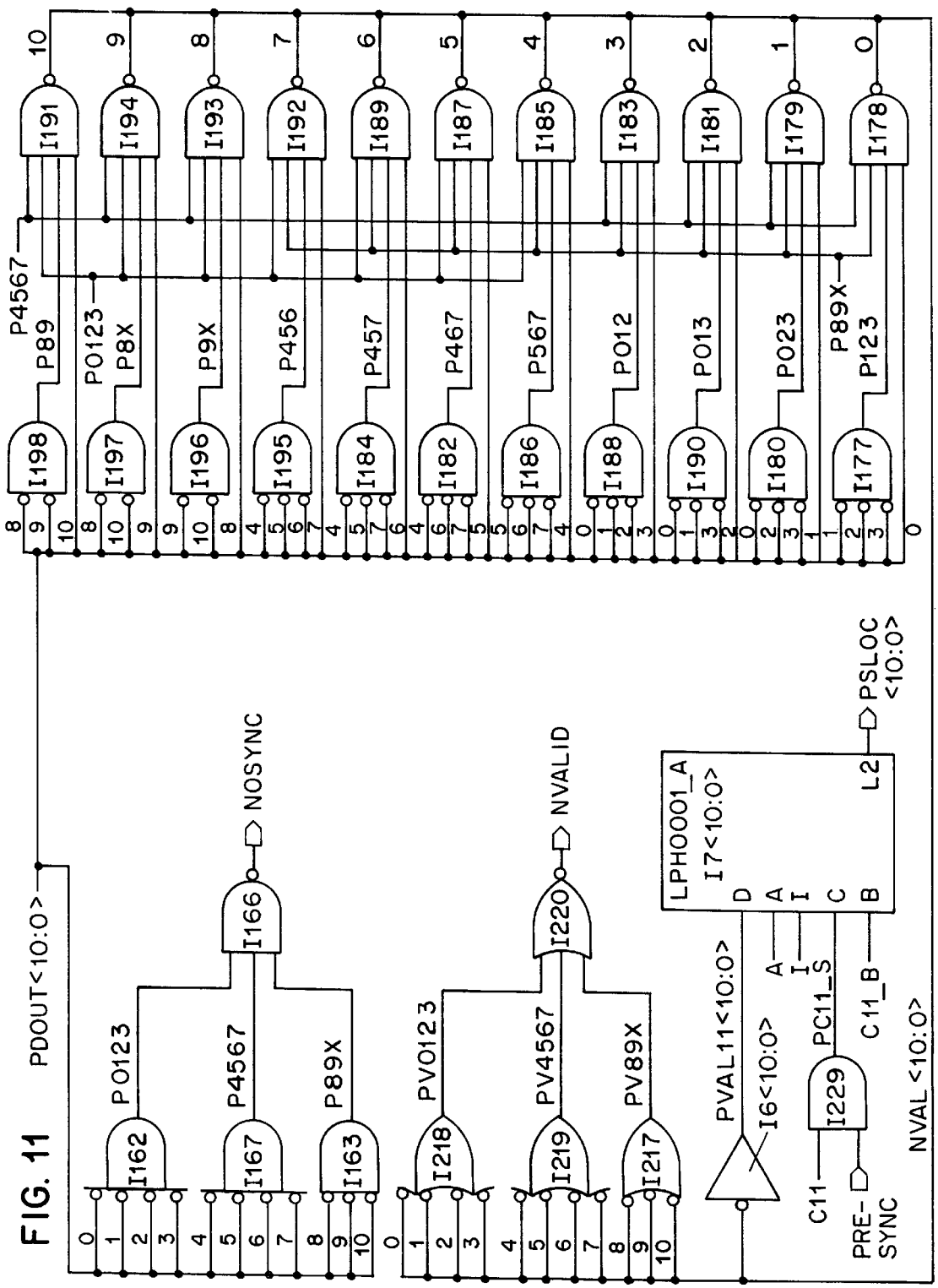
FIG. 11 depicts a circuit diagram of a SYNC evaluation and location pointer.

FIG. 11 relates particularly to a transition evaluation and location pointer, E10G66_SYNC11. In connection therewith, if the contents of register I1<10:0> are all zeros, the NOSYNC output is asserted to signal to the state machine that the block boundary is not in the current set of 11 bits. Any of the eleven NVAL<10:0> can only be asserted when there is a single one present. This condition is signalled to the state machine for further evaluation by the output NVALID. If the state machine determines that a reliable 66-bit block boundary has been found, it must assert PRESYNC for at least one C11 clock cycle to reset the location pointers PSLOC<10:0> to the new value. In the normal data mode, the state machine ignores the NOSYNC and NVALID signals.

After a successful search, the first bit of a 66-bit block can be identified by the combination of timing information C11(x) modulo six (PSEL11<5:0>) from the state machine and the location pointer PSLOC<10:0> to any of the eleven bits I1<10:0>.

Figure 13:
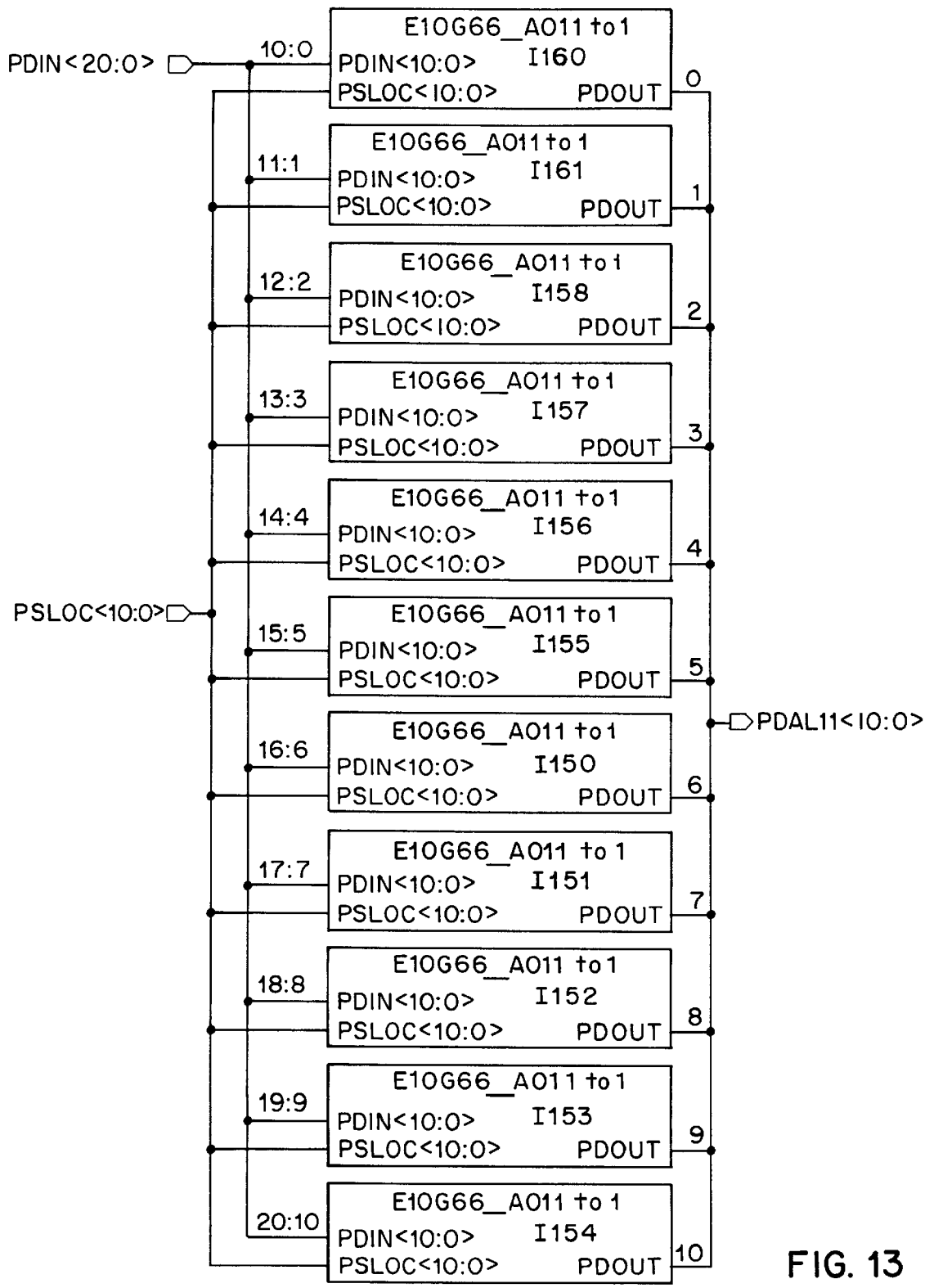
FIG. 13 depicts a circuit diagram to select a set of 11 bits.
Figure 14:
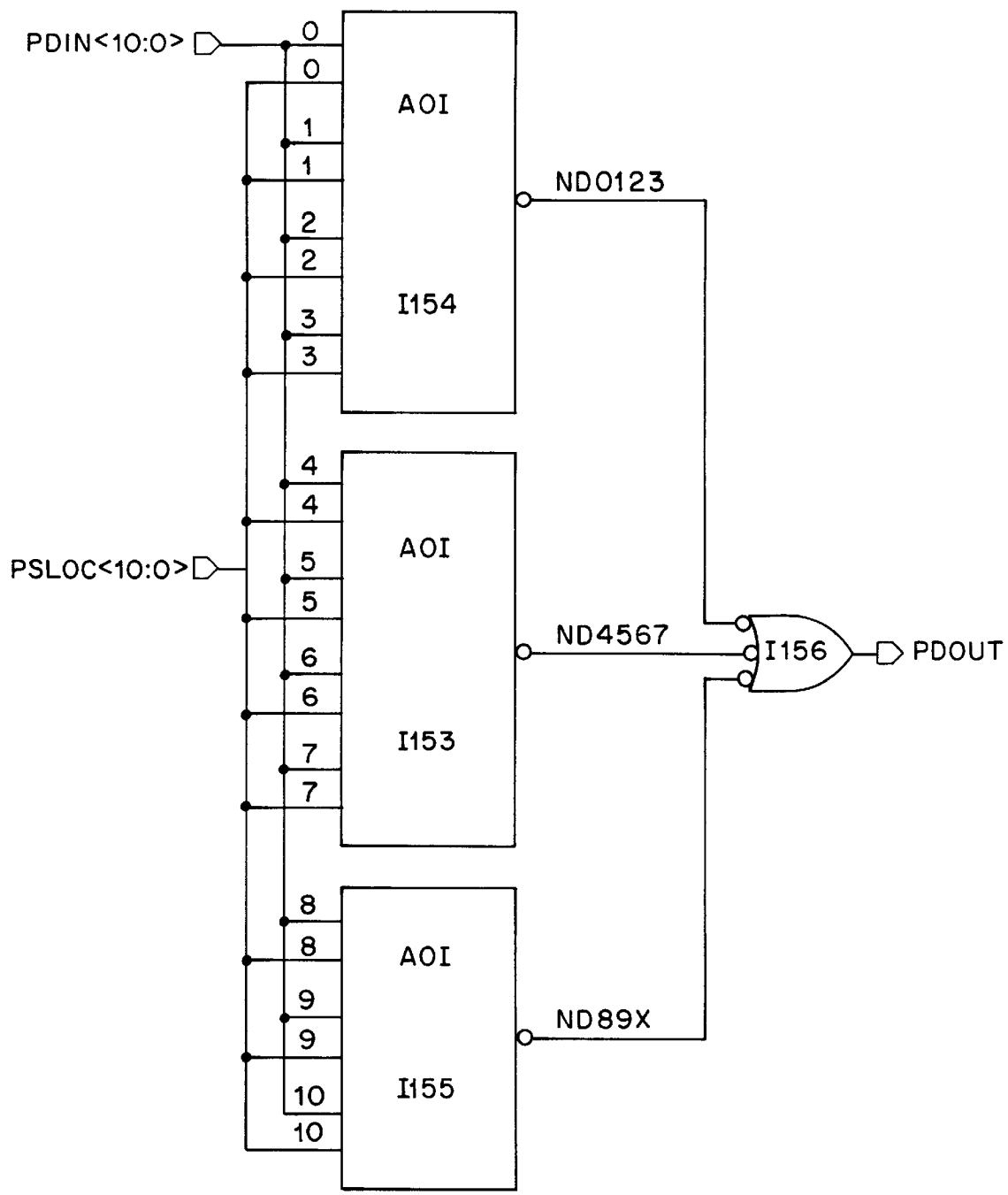
FIG. 14 depicts a circuit diagram of an 11 to 1 multiplexer using AOI gates.

FIG. 13 relates to alignment circuits, E10G66_SEL11. The origin of 11-bit segments in the registers of circuit E10G66_sync11 (FIG. 10) can be selected via the control lines PSLOC<10:0> from 11 different locations. The circuit implementation of these 11 to 1 multiplexers uses AOI gates as shown in circuit E10G66_AO11 to 1, FIG. 14, in preference to path gates because of the much smaller silicon area (i.e., surface area of the silicon chip). However, the path gates would provide a faster path for the data.

Figure 15:
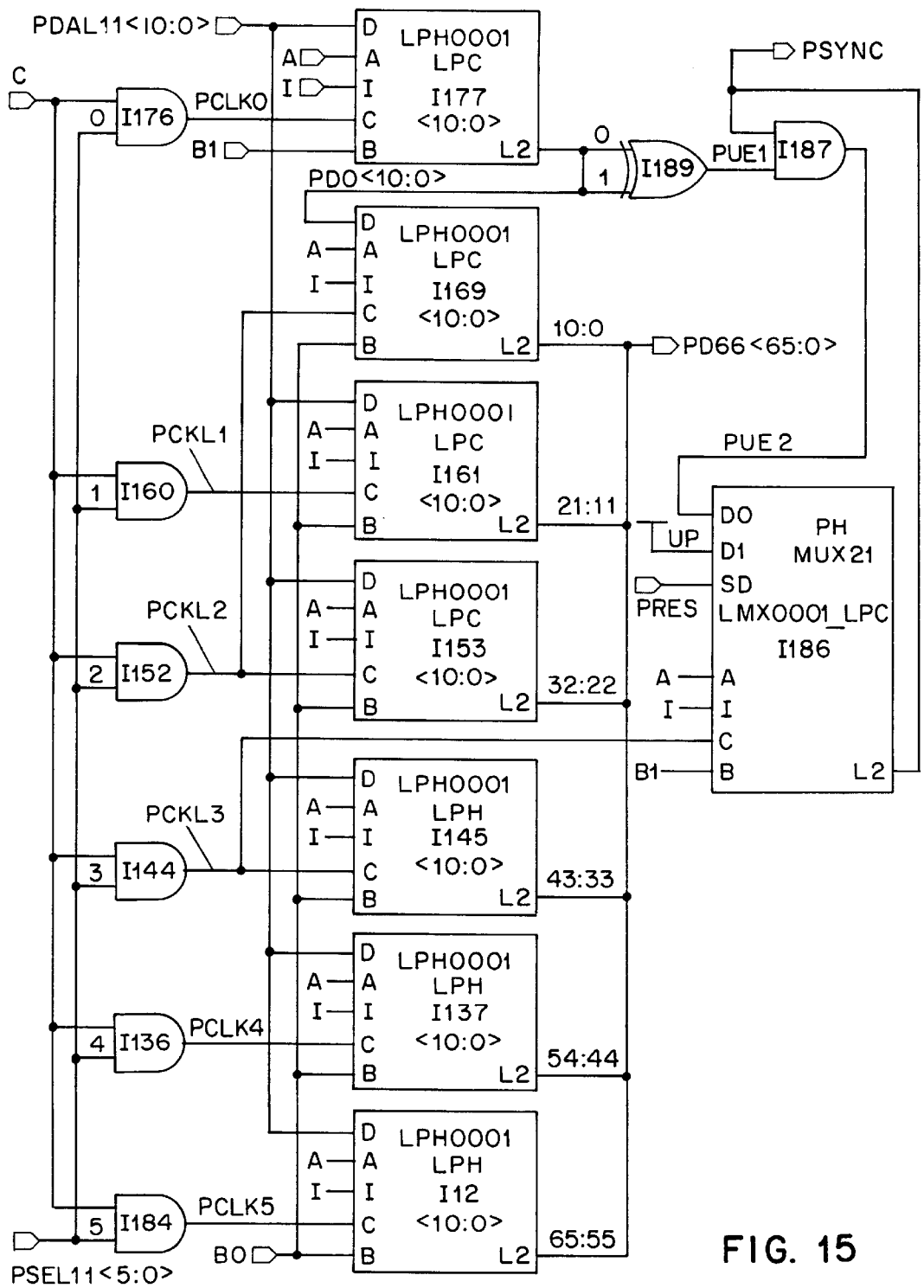
FIG. 15 depicts a circuit diagram of a 66-bit register with clock gates and a SYNC monitor.

FIG. 15 relates to a 66-bit Register with Clock Gates and SYNC Monitor. The L1 latches of the 66-bit output register are updated by six consecutive sets of 11 bits with their respective C clocks gated by the control signals PSEL11<5:0> from the state machine. In addition, the first set of bits is stored in a holding buffer at the top of the diagram (I177<10:0>) and then transferred to the output register I169<10:0> by the clock PCLK2 to avoid timing conflicts with the B0 clock. The contents of the L1 latches is transferred to the L2 latches by the B0 clock which has similar timing as PCLK0. B1 has timing comparable to PCLK1.

The circuitry in the upper right quadrant monitors for unequal bits in the first two bit positions. Any set of equal bits in these positions forces the PSYNC output to the lower level and it will remain there until the latch is reset by the state machine via the PRES line.

Within the scope of the present invention, some alternate approaches to framer structure are conceivable. Above, it has been described how the size of the first register may be changed in response to different technology performance parameters. However, much of the design described above operates with a bus width of 11 bits which is well matched to the performance of IBM CMOS ASIC SA-27E. As faster technologies become available, it might be advisable to change to a 6-bit format to save circuit area. Thus, while one now may construct a 66-bit block with six 11-bit segments, one might then do the same with eleven 6-bit segments. As pointed out previously, with faster logic, the input register could perhaps be reduced to 32 bits. A cycle of 3×32=96 nicely meshes with the 6-bit format without skipping.

It is to be understood that the present invention, in accordance with at least one presently preferred embodiment, includes an input interface which accepts data having a 16-bit width, a converter which converts the 16-bit width data to data having a 66-bit width in aligned format and an output interface which outputs the aligned 66-bit width data. Together, the input interface, converter and output interface may be implemented on at least one general-purpose computer running suitable software programs. These may also be implemented on at least one Integrated Circuit or part of at least one Integrated Circuit. Thus, it is to be understood that the invention may be implemented in hardware, software, or a combination of both.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be made therein by one skilled in the art without departing from the scope or spirit of the invention.

What is claimed is:

1. An apparatus for converting data, said apparatus comprising:
   an input interface which accepts data having a 16-bit width;
   a converter which converts the 16-bit width data to data having a 66-bit width in aligned format; and
   an output interface which outputs the aligned 66-bit width data;
   wherein said converter is adapted to assume a hunt mode, in which said converter is adapted to ascertain at least one of: at least one transition between bits and at least one boundary between groups of bits; and
   wherein said converter comprises an alignment circuit which aligns data of 66-bit width, prior to the output of aligned 66-bit width data, via accepting six consecutive sets of 11 bits.

2. The apparatus according to claim 1, wherein said converter is adapted to initially convert the 16-bit width data to 11-bit width data.

3. The apparatus according to claim 1 wherein said converter, in said hunt mode, is adapted to ascertain transitions between bits and, for each check cycle, transition flags for each bit position indicate whether a transition has occurred and once it is ascertained a transition has not occurred, subsequent transition flags have a value corresponding to "no transition".

4. The apparatus according to claim 1, wherein said converter comprises a parallel examination circuit which examines 12 bits at a time for "01" or "10" patterns.

5. The apparatus according to claim 1, wherein said converter comprises a serial examination circuit which ascertains whether, at an interval of a given number of clock cycles apart, there are unequal bit pairs or sync patterns.

6. The apparatus according to claim 5, wherein said serial examination circuit is adapted to ascertain, for 11 threads in parallel, whether there are unequal bit pairs or sync patterns at an interval of six clock cycles apart.

7. The apparatus according to claim 1, wherein said converter comprises a multiplexer which converts 16 bit wide data to 12 bit wide data on 11-bit increments.

8. The apparatus according to claim 7, wherein said multiplexer is adapted to write the 16 bit wide data into a 64-bit register.

9. The apparatus according to claim 7, wherein said converter comprises a receiving register, the size of said receiving register being an integer multiple of the width of input into said receiving register wherein, after a predetermined number of 16-bit write-cycles into consecutive 16-bit register-segments of said receiving register, the writing of a single 16-bit segment of said receiving register is skipped.

10. A method for converting data, said method comprising the steps of:
    accepting data having a 16-bit width;
    converting the 16-bit width data to data having a 66-bit width in aligned format; and
    outputting the aligned 66-bit width data;
    wherein said converting step comprises a hunt mode for ascertaining at least one of: at least one transition between bits and at least one boundary between groups of bits; and
    wherein said converting step comprises aligning data of 66-bit width, prior to the output of aligned 66-bit width data, via accepting six consecutive sets of 11 bits.

11. The method according to claim 10, wherein said converting step comprises initially converting the 16-bit width data to 11-bit width data.

12. The method according to claim 10, wherein said hunt mode comprises ascertaining transitions between bits and, for each check cycle, transition flags for each bit position indicate whether a transition has occurred and once it is ascertained a transition has not occurred, subsequent transition flags have a value corresponding to "no transition".

13. The method according to claim 10, wherein said converting step comprises examining 12 bits at a time for "01" or "10" patterns.

14. The method according to claim 10, wherein said converting step comprises ascertaining whether, at an interval of a given number of clock cycles apart, there are unequal bit pairs or sync patterns.

15. The method according to claim 14, wherein said ascertaining step comprises ascertaining, for 11 threads in parallel, whether there are unequal bit pairs or sync patterns at an interval of six clock cycles apart.

16. The method according to claim 10, wherein said converting step comprises converting 16 bit wide data to 12 bit wide data on 11-bit increments.

17. The method according to claim 16, wherein said converting step comprises writing the 16 bit wide data into a 64-bit register.

18. The method according to claim 16, wherein said converting step comprises writing into a receiving register, the size of said receiving register being an integer multiple of the width of input into said receiving register wherein, after a predetermined number of 16-bit write-cycles into consecutive 16-bit register-segments of said receiving register, the writing of a single 16-bit segment of said receiving register is skipped.

19. A program storage device readable by machine, tangibly embodying a program of instructions executable by the machine to perform method steps converting data, said method comprising the steps of:

accepting data having a 16-bit width;

converting the 16-bit width data to data having a 66-bit width in aligned format; and outputting the aligned 66-bit width data;

wherein said converting step comprises a hunt mode for ascertaining at least one of: at least one transition between bits and at least one boundary between groups of bits; and wherein said converting step comprises aligning data of 66-bit width, prior to the output of aligned 66-bit width data, via accepting six consecutive sets of 11 bits.

* * * * *

UNITED STATES PATENT AND TRADEMARK OFFICE
CERTIFICATE OF CORRECTION

PATENT NO. : 6,429,794 B1
DATED : August 6, 2002
INVENTOR(S) : Widmer et al.

It is certified that error appears in the above-identified patent and that said Letters Patent is hereby corrected as shown below:

Column 9,
Line 8, "method stepsconverting data" should read -- method steps for converting data --;

Signed and Sealed this

Eleventh Day of February, 2003

JAMES E. ROGAN
*Director of the United States Patent and Trademark Office*